United States Patent [19]
Watkin

[11] 4,202,623
[45] May 13, 1980

[54] TEMPERATURE COMPENSATED ALIGNMENT SYSTEM

[75] Inventor: Theodore Watkin, Stamford, Conn.

[73] Assignee: The Perkin-Elmer Corporation, Norwalk, Conn.

[21] Appl. No.: 1,991

[22] Filed: Jan. 8, 1979

[51] Int. Cl.² .............................................. G03B 27/52
[52] U.S. Cl. ................................................... 355/30
[58] Field of Search .................... 355/18, 30, 125, 132

[56] References Cited

U.S. PATENT DOCUMENTS

| | | | |
|---|---|---|---|
| 3,531,196 | 9/1970 | Kosanke et al. | 355/18 |
| 3,610,750 | 10/1971 | Lewis et al. | 355/18 X |
| 3,826,569 | 7/1974 | Sakamaki et al. | 355/30 X |
| 3,937,579 | 2/1976 | Schmidt | 355/132 X |
| 4,011,011 | 3/1977 | Hemstreet et al. | 355/18 |
| 4,147,429 | 4/1979 | Lysle | 355/132 X |

FOREIGN PATENT DOCUMENTS

1211839  11/1970  United Kingdom ...................... 355/30

Primary Examiner—Donald A. Griffin
Attorney, Agent, or Firm—Salvatore A. Giarratana; Francis L. Masselle; Edwin T. Grimes

[57] ABSTRACT

A temperature control system for adjusting the temperature of a projection mask to cause it to align optically with a wafer, and thereafter, to automatically maintain the temperature differential between the mask and wafer constant.

15 Claims, 3 Drawing Figures

TEMPERATURE COMPENSATED ALIGNMENT SYSTEM

BACKGROUND OF THE INVENTION

The manufacture of integrated circuits involves the printing of circuit patterns on a wafer of silicon. One method of printing the circuit patterns on a wafer involves coating the wafer with a photo-resist material. When exposed to light the photo-resist material polymerizes into a hard tenacious coating, whereas the unexposed portions of the layer are easily removed, e.g. by means of a solvent or developer. A glass or quartz disc which is opaque except for transparent areas comprising the circuit pattern is disposed in an optical arrangement for projecting the circuit pattern onto the wafer. In practice the circuit pattern is repeated on the mask in rows and columns such that each wafer contains a plurality of identical circuit patterns. Also circuit patterns on each wafer are built up layer by layer using a different mask for each layer until a complete circuit is formed. The wafer which contains a plurality of identical circuits is then cut along rows and columns producing a plurality of separate circuits or chips.

One system for projecting circuit patterns of a mask onto a wafer is disclosed in U.S. Pat. No. 4,011,011, entitled Optical Projections Apparatus, issued on Mar. 8, 1977, having the same assignee as the present application. This patent discloses the optical projection and alignment arrangement necessary to such a system.

In such a projection system alignment of the mask and wafer is critical. This is particularly true where layers of circuits are formed sequentially on a wafer. Errors of just a few microns may result in unaligned elements of a circuit element. The referenced patent overcomes to a large extent the problems of alignment.

However, it has been found that a mask cannot be perfectly aligned for projection onto a wafer without taking into account the change in size due to thermal expansion or contraction of the glass mask in the radial direction. While the glass disc may change dimension in the axial or thickness direction, such does not affect alignment.

The present invention contemplates a system for compensating for change in dimension of the mask due to temperature.

SUMMARY OF THE INVENTION

The present invention contemplates a temperature control system wherein targets on a projection mask are aligned with corresponding targets on a wafer by adjusting the temperature of the mask to visually align the targets. After initial alignment is accomplished means are provided to maintain the temperature difference between the mask and wafer constant to cause alignment to be continuously maintained.

A housing enclosing a chamber or recess having a heater disposed therein has preconditioned air introduced into it where it circulates past the heater and thence out of the chamber through means causing the air to bathe each side of the mask. A thermistor associated with the mask and one associated with the wafer are connected to a heater control unit. The mask is aligned with the wafer by an operator viewing the mask pattern projected onto the wafer and simultaneously adjusting the temperature of the mask by varying the temperature of the air bathing the mask until the mask's dimensions are appropriately changed. Once aligned, the temperature differential of the mask and wafer as sensed by the thermistors is maintained constant by the heater control unit.

DESCRIPTION OF THE DRAWINGS

The invention is described below in conjunction with the accompanying drawings, in which.

DESCRIPTION

Figure 1:
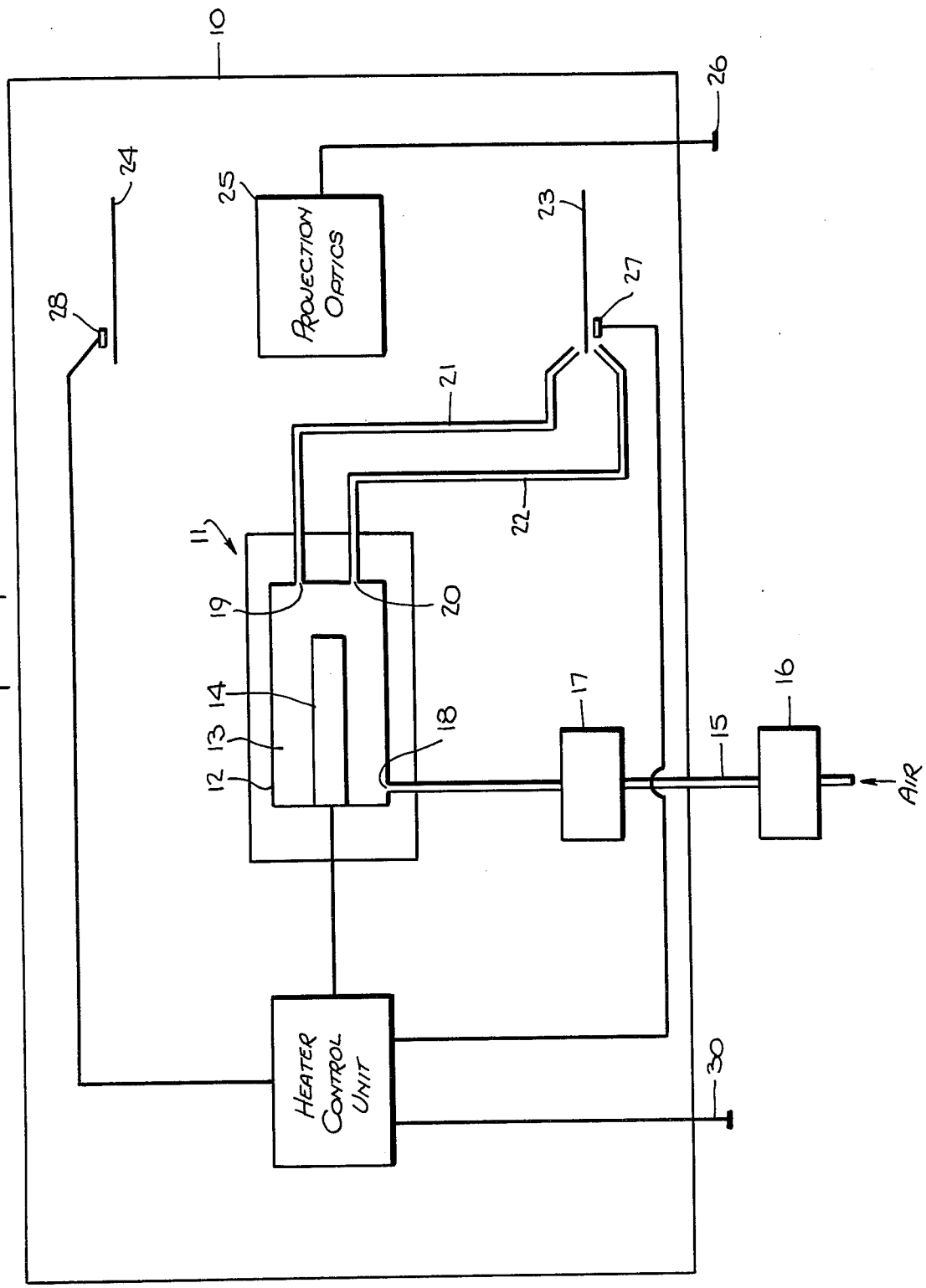
FIG. 1 illustrates the system of the present invention.

Referring now more particularly to FIG. 1 there is shown the temperature control system of the present invention. This system along with other portions (not shown) of the mask projection system as described in U.S. Pat. No. 4,011,011, previously referred to, are disposed in a housing 10. Housing 10 is a relatively airtight housing which provides through filtering and air-conditioning a clean air temperature controlled environment for the mask projection system. The means for filtering and conditioning the air in housing 10 forms no part of the present invention and is, therefore, not shown. It should be noted, however, that the air in housing 10 is maintained relatively dust free to prevent particles from depositing on the wafer and particularly on the mask such that on projection of the mask onto the wafer the circuit patterns are not distorted or incorrect due to the dust particles being projected as part of the circuit pattern. In addition, the air in the housing is maintained at a constant temperature of e.g. 70° F.

Disposed in housing 10 is a temperature control unit 11. The temperature control unit 11 comprises a housing 12 which may be formed of any heat resistant material e.g. Teflon. The housing 12 encloses a cylindrical space or chamber 13. Disposed within chamber 13 is a heater element 14 fixed to one end of a wall of the chamber 13.

Air is introduced into chamber 13 via tube 15. Prior to entry into chamber 13, the air is passed through an air conditioner 16 so that the air introduced into the chamber 13 is at a temperature less than the ambient temperature in the housing 10. This is necessary inasmuch as the heater unit 14 can only heat the air and not cool it.

The air is also filtered in filter 17 to remove dust particles therefrom prior to entry into chamber 13.

The other end of the chamber has ports 19 and 20 connected to tubes 21 and 22, having their ends disposed on the sides, respectively, of a mask 23.

The mask 23, which is inserted and held within the housing 10 in a manner similar to that described in referenced U.S. Pat. No. 4,011,011. As disclosed in that patent the mask 23 is disposed for projection of the circuit pattern thereon onto a silicon wafer via the projection optics. In the present application, a wafer 24 is shown with the projection optics 25 positioned between it and the mask 23.

Reference numeral 26 indicates a viewer disposed outside of housing 10 and connected to the projection optics 25 by which an operator may view the alignment of the mask 23 and the wafer 24 in a manner similar to that disclosed in reference U.S. Pat. No. 4,011,011.

A temperature indicator such as, for example, a thermistor 27 is disposed adjacent the mask 23 for sensing the temperature thereof.

A second thermistor 28 is disposed adjacent the wafer 24 for sensing the temperature thereof.

The thermistors 27 and 28 are electrically connected to heater control unit 29. A control 30 located outside the vicinity of the heater is also connected to heater control unit 29.

Air entering the chamber 13 via port 18 spirals around the heater 14 through the ports 19 and 20. The air passes through the tubes 21 and 22 and is caused to bathe both sides of the mask 23, the ends of which may be fanned to evenly heat the mask. It should be noted that even though filtered, this air may contain some dust particles which often contain a charge and are therefore, prone to stick to the mask. Thus, it may be desirable to place a deionizing element in the vicinity of the emitted air to neutralize the particles and prevent their sticking to the mask. The particles are then blown away from the mask 23 by the emitted air.

The mask 23 is made of conventional mask material such as glass and changes dimension with temperature according to its coefficient of thermal expansion. Thus, even after the mask 23 has been inserted and positioned with respect to the wafer 24, the size of the mask may be such as to prevent precise alignment and projection of the circuit pattern. Therefore, by use of temperature regulated air bathing each side of the mask 23, the size of the mask can be expanded until precise alignment with the wafer 24 is obtained. Once alignment is obtained, the temperature differential of the air bathing the mask 23 and the temperature of the wafer 24 or more particularly the air ambient to the wafer 24 can be adjusted and hence maintained constant.

In operation, initial sizing of the mask to cause it to expand and increase its radial dimension to align precisely with the wafer is accomplished by an operator viewing the projection of the mask pattern on wafer through eyepiece 26. While so viewing control 30 is turned to vary e.g. increase power to the heater 13 to heat air entering chamber 13 and change the temperature of the air bathing the mask 23 via tubes 21 and 22. At some point the alignment is precise as may be determined by aligning targets on the mask 23 with corresponding targets on the wafer 24. At this time, the heater control unit functions to maintain the temperature differential between the wafer 24 and mask 23.

Figure 2:
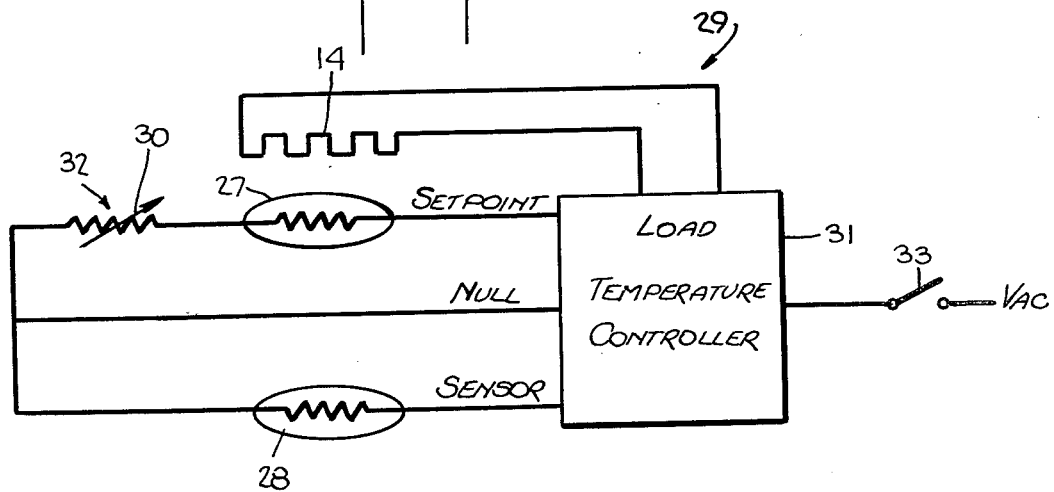
FIG. 2 is a detailed representation of the circuit of the heater control unit of FIG. 1.

FIG. 2 illustrates heater control unit 29 in schematic form. A temperature controller 31 is connected to a source of a.c. voltage via switch 33.

The thermistor 28, which is associated with the wafer 24, has one end connected as a sensor input to the controller 31 and its other end connected to a null input to the controller 13.

The thermistor 27, which is associated with the mask 23 has one end connected as a set point input to the controller 31 and its other end connected to one side of a potentiometer 32. The other side of the potentiometer is connected to the null input to the controller 31. The heater 14 which is the load is also connected to the controller 31.

The resistance varying portion 30 of the potentiometer 32 is the same as control 30 in FIG. 1 and is initially in the zero resistance position. When switch 33 is closed, heater 14 is turned on until the resistance of the potentiometer 32 plus the resistance of thermistor 27 equals the resistance of the thermistor 28 i.e. the resistance between set point and null equals the resistance between the sensor and null. When the resistances are equal the heater 14 turns off. When this occurs the resistance of the thermistor 27 increases creating an unbalance. The heater 14 again turns on to lower the resistance of the thermistor 27. As can be seen, the heater 14 is constantly turned on and off to maintain the null. The temperature of the air around the wafer 24 is followed by the temperature of the air around the mask 23 keeping the temperatures of the mask 24 and wafer 23 equal.

Once this stabilization is achieved, an operator views the alignment of the wafer 23 and mask 24 to see if mask temperature must be increased to obtain alignment. If so, he turns control 30 to increase the resistance in the set point of the circuit. The heater 14 is turned on until the resistance of the thermistor 27 decreases until the balance point is reached. Since the operator will have increased the resistance of the potentiometer 32 until the mask 23 has changed in size to correctly align with the wafer 24, the resistances will balance at a null point that maintains a temperature difference between the mask 23 and wafer 24. As before, the heater 14 will turn off at the null point and on again when the resistance of the thermistor 27 has increased to an unbalanced state. The heater 14 will turn on and off as necessary to maintain the balance point and the temperature differential to keep mask temperature at the set point.

If in order to align the mask and wafer, it is necessary to decrease the mask temperature from the initial balance point i.e. after initially balancing the circuit of FIG. 2, the potentiometer 32 would have to be switched into the sensor side of the circuit or, alternatively, have a potentiometer built into that side and controlled by separate control similar to control 30.

The temperature controller 31 is a conventional item such as the temperature controller manufactured by RFL Industries, Inc., of Boonton, New Jersey, Model 72A.

Figure 3:
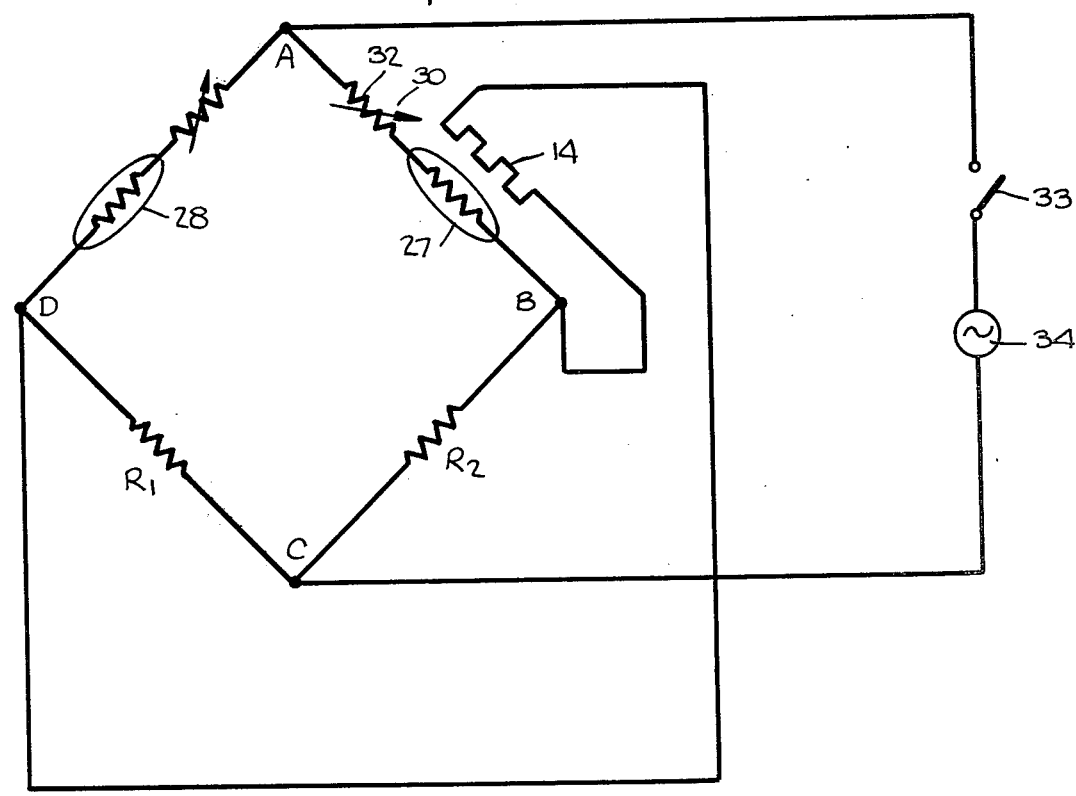
FIG. 3 is an alternative circuit representation that can be used as the heater control unit of FIG. 1.

FIG. 3 illustrates another arrangement for changing the temperature of the mask 23 and then maintaining the temperature difference between the mask 23 and the wafer 24 with like reference numerals indicating like elements. The circuit is a Wheatstone bridge with thermistor 28 and the thermistor 27 along with potentiometer 32 forming the two balancing legs of the bridge. The other legs contain equal resistance $R_1$ and $R_2$.

Power is supplied via a.c. source 34 connected as shown to points A and C. Heater 14 is connected between points B and D.

With potentiometer 32 set at zero resistance, the resistances of thermistors 27 and 28 will equalize when switch 33 is closed, since any voltage difference between points B and D will cause heater 14 to appropriately change the resistance of thermistor 27.

To obtain alignment of the mask 23 and wafer 24, control 30 is moved until alignment is achieved i.e. by unbalancing the bridge, voltage is applied to heater 14 which changes the temperature and, therefore, the size of mask 23 until alignment takes place. At this time, control 30 is stopped and the bridge automatically rebalances by changing the resistance of thermistor 27 such that its resistance plus the resistance of the potentiometer 32 now in the circuit equals the resistance of the thermistor 28. When this occurs, the temperature difference between the mask 23 and wafer 24 is automatically maintained constant by the action of the bridge. Thus, any change in temperature of the mask 23 or wafer 24 is sensed by the resistance change of the respective thermistors 27 and 28 with the bridge automatically changing the resistance of thermistor 27 by the heater 14 to maintain the balanced condition and, therefore, the temperature differential necessary to maintain alignment.

It should be noted that alignment could also be achieved by heat controlling the size of the wafer 24 instead of mask 23. In this case the wafer 24 would be bathed in temperature controlled air from tubes 21 and 22 with thermistors 27 and 28 physically changing places in the system of FIG. 1 and electrically in the circuits of FIGS. 2 and 3.

Other modifications of the invention are possible in light of the above description which should not be construed as placing any limitation thereon other than those limitations expressed in the claims which follow.

What is claimed is:

1. In a projection system for exposing a silicon wafer to circuit patterns on a mask by optically projecting the circuit patterns onto the wafer, apparatus for correction misalignment between the mask and wafer due to changes in dimension of the mask or wafer due to temperature comprising,
    first means for viewing the projection of the mask on the wafer,
    second means for aligning the viewed mask and wafer to a predetermined standard by adjusting the temperature of the mask or wafer.

2. Apparatus according to claim 1 wherein said second means includes:
    heater means for bathing each side of the mask with temperature controlled air.

3. Apparatus according to claim 2 wherein said heater means comprises,
    a housing enclosing a chamber,
    a heater disposed in said chamber,
    said housing having first opening means for introducing air and second opening means for emitting air to each side of the mask.

4. Apparatus according to claim 3 wherein,
    said first opening means includes filter means for removing solid impurities from the air and air conditioning means for cooling the air to a predetermined temperature level.

5. Apparatus according to claim 4 wherein,
    said second opening means comprises two tubes for directing air on each side of the mask.

6. Apparatus according to claim 5 wherein said first means comprises,
    projection optic means including means for viewing the alignment of the mask with the wafer.

7. Apparatus according to claim 6 wherein said second means includes,
    heater control means connected to said heater,
    said heater control means including control means for varying the temperature of said heater to change the temperature of the air bathing the mask from said second opening.

8. Apparatus according to claim 7 wherein said heater control means further comprises,
    temperature sensing means associated with the mask and the wafer,
    said control means connected to said temperature sensing means maintaining the temperature difference between mask and wafer constant after alignment has been achieved.

9. Apparatus according to claim 8 wherein said temperature sensing means includes,
    a first thermistor disposed adjacent the wafer,
    a second thermistor disposed adjacent the mask.

10. Apparatus according to claim 9 wherein said control means comprises,
    a source of electrical power,
    a variable resistance having one end connected to one side of said second thermistor and its other end connected to a balance point,
    said first thermistor having one side connected to said balance point,
    balancing means connected to said source, said balance point, the other side of each of said first and second thermistors,
    and to said heater for continuously causing the resistance of said second thermistor plus the resistance of said variable resistance to be equal to the resistance of said first thermistor.

11. Apparatus according to claim 10 further including means for varying said variable resistance until the mask and wafer are in alignment.

12. Apparatus according to claim 11 wherein said variable resistance is connected between said balance point and said one side of said first thermistor.

13. Apparatus according to claim 9 wherein said control means comprises,
    a Wheatstone bridge,
    a variable resistance and said second thermistor forming one arm of said bridge,
    said first thermistor forming the second arm of said bridge,
    first and second equal resistances forming the third and fourth arms of said bridge,
    a source of electrical power connected between the junction of said first and second arms and the junction of said third and fourth arms,
    said heater connected between the junction of said second and fourth arms and the junction of said first and third arms of said bridge.

14. Apparatus according to claim 13 wherein said second arms contains a variable resistor.

15. Apparatus according to claim 2 wherein said second means includes means for maintaining the temperature difference between the mask and wafer constant after the mask and wafer are aligned.

* * * * *